United States Patent
Zhou et al.

(10) Patent No.: US 11,031,448 B2
(45) Date of Patent: Jun. 8, 2021

(54) ORGANIC LIGHT EMITTING DIODE (OLED) DISPLAY PANEL AND THE MANUFACTURING METHOD THEREOF

(71) Applicant: SHENZHEN CHINA STAR OPTOELECTRONICS SEMICONDUCTOR DISPLAY TECHNOLOGY CO., LTD., Guangdong (CN)

(72) Inventors: Xingyu Zhou, Guangdong (CN); Jia Tang, Guangdong (CN); Xiaoxing Zhang, Guangdong (CN); Yuan Jun Hsu, Guangdong (CN)

(73) Assignee: SHENZHEN CHINA STAR OPTOELECTRONICS SEMICONDUCTOR DISPLAY TECHNOLOGY CO., LTD., Guangdong (CN)

( * ) Notice: Subject to any disclaimer, the term of this patent is extended or adjusted under 35 U.S.C. 154(b) by 507 days.

(21) Appl. No.: 16/071,519

(22) PCT Filed: Mar. 8, 2018

(86) PCT No.: PCT/CN2018/078475
§ 371 (c)(1),
(2) Date: Jul. 20, 2018

(87) PCT Pub. No.: WO2019/148580
PCT Pub. Date: Aug. 8, 2019

(65) Prior Publication Data
US 2021/0083028 A1    Mar. 18, 2021

(30) Foreign Application Priority Data
Jan. 30, 2018  (CN) .......................... 201810087853.1

(51) Int. Cl.
*H01L 29/08* (2006.01)
*H01L 27/32* (2006.01)
*H01L 51/56* (2006.01)

(52) U.S. Cl.
CPC .......... *H01L 27/3258* (2013.01); *H01L 51/56* (2013.01); *H01L 2227/323* (2013.01)

(58) Field of Classification Search
CPC ................ H01L 27/3258; H01L 51/56; H01L 2227/323
See application file for complete search history.

(56) References Cited

U.S. PATENT DOCUMENTS

2009/0146559 A1* 6/2009 Chan .................... H01L 51/5265
                                                                            313/505
2015/0028292 A1* 1/2015 Kang .................. H01L 27/3258
                                                                            257/40
(Continued)

FOREIGN PATENT DOCUMENTS

CN      102450102 A    5/2012
CN      105070847 A    11/2015
(Continued)

OTHER PUBLICATIONS

International Search Report in Application No. PCT/CN2018/078475, 8PP.
(Continued)

*Primary Examiner* — Phuc T Dang
(74) *Attorney, Agent, or Firm* — Leong C. Lei

(57) ABSTRACT

The present disclosure relates to an OLED display panel. The OLED display panel includes a TFT array substrate, and a flat layer on the TFT array substrate. The flat layer includes a first flat layer and a second flat layer on the first flat layer. A viscosity of the first flat layer is less than a viscosity of the second flat layer. In addition, the present disclosure also relates to a manufacturing method of the OLED display (Continued)

panel to enhance the performance of the OLED display panel.

20 Claims, 2 Drawing Sheets

(56) References Cited

U.S. PATENT DOCUMENTS

| | | | | |
|---|---|---|---|---|
| 2015/0060781 A1* | 3/2015 | Kang | ................ | H01L 27/3258 |
| | | | | 257/40 |
| 2016/0291750 A1* | 10/2016 | Chai | ..................... | G06F 3/0412 |
| 2018/0097195 A1* | 4/2018 | Inoue | ................. | H01L 51/5012 |
| 2018/0123082 A1* | 5/2018 | Sasaki | ................ | H01L 51/5237 |
| 2018/0366672 A1* | 12/2018 | Wang | ..................... | H01L 51/56 |

FOREIGN PATENT DOCUMENTS

| | | | |
|---|---|---|---|
| CN | 105665247 A | 6/2016 |
| CN | 106773215 A | 5/2017 |
| EP | 1160843 A1 | 12/2001 |
| KR | 2001-0028558 A | 4/2001 |

OTHER PUBLICATIONS

Chinese Office Action issued in corresponding Chinese Application No. 201810087853.1, dated Dec. 4, 2019, China National Intellectual Property Administration, Beijing, China.

* cited by examiner

ORGANIC LIGHT EMITTING DIODE
(OLED) DISPLAY PANEL AND THE
MANUFACTURING METHOD THEREOF

CROSS REFERENCE TO RELATED
APPLICATIONS

This application is a national phase of PCT Patent Application No. PCT/CN2018/078475, entitled "ORGANIC LIGHT EMITTING DIODE (OLED) DISPLAY PANEL AND THE MANUFACTURING METHOD THEREOF", filed on Mar. 8, 2018, which claims priority to Chinese Patent Application No. 201810087853.1, filed on Jan. 30, 2018, both of which are hereby incorporated in its entireties by reference.

BACKGROUND

1. Technical Field

The present disclosure relates to display technology field, and more particularly to an OLED display panel and the manufacturing method thereof.

2. Description of Related Art

An OLED display panel generally includes a TFT array substrate, a planarization layer, and an OLED display layer, and the OLED display layer includes an OLED light-emitting layer. In general, the smoother the planarization layer, the better, so that the film thickness of the OLED emission area is relatively uniform, which may result in more uniform performance of light emission. However, there are various traces and vias on the TFT array substrate, resulting in undulations on the TFT array substrate. The flat layer can reduce the undulation of the TFT array substrate, in particular, when the flattening layer is made of a material with a lower viscosity. However, some gas impurities will be slowly released later. These gas impurities will affect the lifetime of the OLED light emitting layer. If the flattening layer is formed using a material with higher viscosity, the released amount of gaseous impurities can be reduced. Nevertheless, the high viscosity may result in that the flat layer is not very flat. This may cause unevenness of the OLED light emitting region, resulting in non-uniform light emission of the OLED light emitting layer. In summary, a single flat layer is difficult to achieve both good planarization effect and less release of gaseous impurities. Thus, the quality of the OLED display panel may not be good enough.

SUMMARY

The present disclosure relates to an OLED display panel and the manufacturing method thereof to enhance the performance of the OLED display panel.

In one aspect, an organic light emitting diode (OLED) display panel includes: an thin film transistor (TFT) array substrate; a flat layer arranged on the TFT array substrate, the flat layer including a first flat layer and a second flat layer, the second flat layer being arranged on the first flat layer, and a viscosity of the first flat layer being less than a viscosity of the second flat layer; and an OLED display layer arranged on the flat layer.

Wherein the viscosity of the first flat layer is less than 4 centipoise (cP).

Wherein the viscosity of the second flat layer is greater than or equal to 4 cP.

Wherein a thickness of the flat layer is in a range from 1 to 6 µm.

Wherein the thickness of the first flat layer or/and the second flat layer is in a range from 0.5 to 3 µm.

Wherein the first flat layer is made by acrylic material or/and the second planarization layer is made by polyimide material.

Wherein the OLED display layer includes a first electrode layer, a pixel defining layer, an OLED light emitting layer, and a second electrode layer, wherein the first electrode layer is one of an anode and a cathode, and the second electrode layer is the other one of the anode and the cathode.

Wherein the OLED light emitting layer is formed by an inkjet printing process.

Wherein the TFT array substrate includes a base substrate and a TFT layer, and the TFT layer is formed on the base substrate.

In another aspect, a manufacturing method of a OLED display panel includes: forming a TFT array substrate; forming a flat layer on the TFT array substrate, wherein the flat layer includes at least a first flat layer and a second flat layer, the second flat layer is located on the first flat layer, a viscosity of the first flat layer is less than the viscosity of the second flat layer; and forming an OLED display layer on the flat layer.

In view of the above, the flat layer includes a first flat layer and a second planarization layer, the second flat layer is located on the first planarization layer, and the first flat layer has a lower viscosity than the second planarization layer. The viscosity of the first layer is lower, so that the flattening effect of the first flat layer is good. The film thickness of the subsequently formed OLED light emitting layer is also relatively uniform, so does the light emission. In addition, the amount of gaseous impurities is relatively small, and gas impurities generated from the underlying film layer can be prevented from being transmitted upward. As such, the influence of gas impurities on the OLED display layer can be reduced. Therefore, the overall quality of the OLED display panel is better.

BRIEF DESCRIPTION OF THE DRAWINGS

In order to more clearly illustrate the embodiments of the present disclosure or prior art solutions, the drawings used in the description of the embodiments or prior art will be briefly described below. The drawings are merely some embodiments of the present disclosure, and those skilled in the art can also obtain other drawings based on these drawings without any creative work.

DETAILED DESCRIPTION

Following embodiments of the invention will now be described in detail hereinafter with reference to the accompanying drawings.

The terms "including" and "having" and their conjugates, as used in the present disclosure, claims, and drawings, are intended to cover non-exclusive inclusions. For example, a process, method, system, product, or device that comprises a series of steps or units is not limited to the listed steps or units, but may optionally include steps or units that are not listed, or alternatively may also include other steps or units inherent to these processes, methods, products, or equipment. Furthermore, the terms "first," "second," and "third," etc. are used to distinguish different objects and not to describe a particular sequence.

Figure 1:
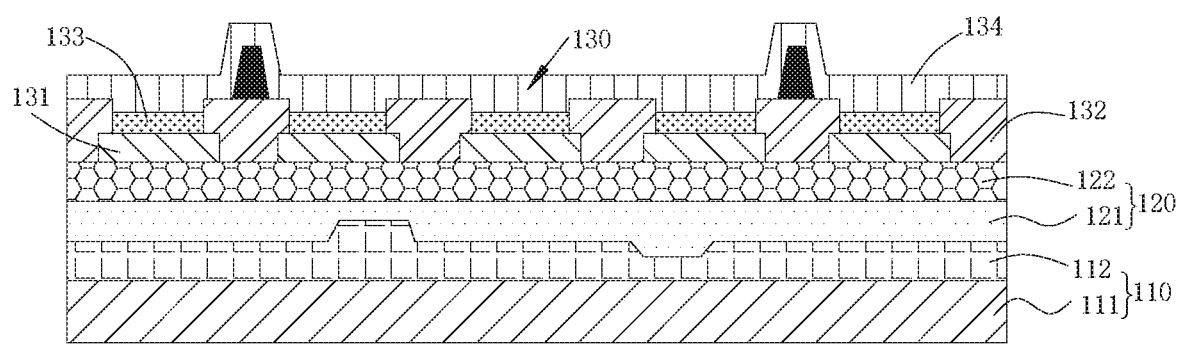
FIG. 1 is a schematic view of the OLED display panel in accordance with one embodiment of the present disclosure.

FIG. 1 is a schematic view of the OLED display panel in accordance with one embodiment of the present disclosure. The OLED display panel includes a TFT array substrate 110, a flat layer 120, and an OLED display layer 130.

In one embodiment, the TFT array substrate 110 includes a base substrate 111 and a TFT layer 112. The base substrate 111 may be a glass or a plastic substrate. The TFT layer 112 is formed on the base substrate 111. The TFT layer 112 includes a plurality of TFTs. Each of the TFTs includes a gate, a gate insulation layer, a semiconductor layer, a source, and a drain.

In this embodiment, the TFT may be an amorphous silicon (a-Si) TFT, a low temperature polysilicon (LTPS) TFT, a metal oxide TFT or the like. In addition, in the embodiment, the TFT layer 112 further includes a plurality of scan lines and a plurality of data lines, a plurality of scan lines extending along the first direction, and a plurality of data lines extending along the second direction. The second direction is perpendicular to the first direction.

In one embodiment, the flat layer 120 is formed on the TFT array substrate 110. The flat layer 120 includes at least a first flat layer 121 and a second flat layer 122. The first flat layer 121 is located on the TFT array substrate 110, and the second flat layer 122 is located on the first flat layer 121. In order to make the flat layer 120 have a good planarization effect and less gas impurities are released, In one embodiment, the first flat layer 121 has a low viscosity, so that the planarization effect is good. In this way, the light emitting area of the OLED display layer 130 is relatively flat, and the light emission of the OLED display layer 130 is relatively uniform. The viscosity of the second flat layer 122 is higher, so that the gas released from the flat layer 120 can be reduced upwards. In this way, the impact caused by the gas impurities to the OLED display layer 130 can be reduced, such that the lifetime of the OLED display layer 130 may be extended. In this embodiment, the viscosity of the first flat layer 121 is lower than that of the second flat layer 122, so that the first flat layer 121 is relatively loose, which is conducive to the planarization of the first flat layer 121, the second flat layer 122 is relatively dense, and the second flat layer 122 itself generates less gaseous impurities. Thus, the gas impurities generated from the underlying film layer are prevented from being transmitted upward, so that the influence of gas impurities on the OLED display layer 130 can be reduced.

In one embodiment, the viscosity of the first flat layer 121 is less than 4 centipoise (cP), for example, 3.5 centipoise, 3 centipoise, 2.5 centipoise, 2 centipoise, 1.5 centipoise, or 0.5 centipoise, etc. The first flat layer 121 has good fluidity and a good flattening effect. In this embodiment, the material of the first flat layer 121 is, for example, an acrylic material or the like. In this embodiment, the viscosity of the second flat layer 122 is greater than or equal to 4 centipoise (cP), such as 4 centipoise, 5 centipoise, 6 centipoise, 7 centipoise, 8 centipoise, 9 centimeters, or 10 centipoise, etc. Thus, the second flat layer 122 is relatively dense, generates less gaseous impurities, and can also block the upward transfer of gaseous impurities in the underlying layer. In one embodiment, the material of the second flat layer 122 is, for example, a polyimide-based material or the like.

In one embodiment, the OLED display layer 130 is located on the flat layer 120, specifically above the second flat layer 122. The OLED display layer 130 includes a first electrode layer 131, a pixel defining layer 132, an OLED light emitting layer 133, and a second electrode layer 134. The first electrode layer 131 is one of an anode and a cathode. In this embodiment, the second electrode layer 134 is an anode, and the OLED light emitting layer 133 is located between the anode and the cathode. In order to reduce the material cost of the OLED light emitting layer 133, In one embodiment, the OLED light emitting layer 133 is formed by an inkjet printing process, so that the material of the OLED light emitting layer 133 is required by the OLED display panel can be reduced. This can reduce overall costs.

In general, forming the OLED light-emitting layer 133 by an ink-jet printing process requires a very high planarization effect of the underlying layer. If the flatness of the flat layer 120 is relatively poor, the OLED light is formed by an ink-jet printing process, and the light emitting effect of the layer 133 is not good. In this embodiment, the relatively high flatness required by the inkjet printing process can be achieved through the arrangement of the first flat layer 121, so that the OLED display panel of the present disclosure has a relatively low cost and a good light emitting effect.

In one embodiment, the total thickness of the flat layer 120 is 1 μm-6 μm, for example, 1 μm, 2 μm, 3 μm, 4 μm, 5 μm, 6 μm, and the like. Specifically, In one embodiment, the first flat layer 121 has a thickness of 0.5 μm to 3 μm, for example, 0.5 μm, 1 μm, 1.5 μm, 2 μm, 2.5 μm, 3 μm, and the like. The second flat layer 122 has a thickness of 0.5 μm to 3 μm, for example, 0.5 μm, 1 μm, 1.5 μm, 2 μm, 2.5 μm, 3 μm, and the like.

Figure 2:
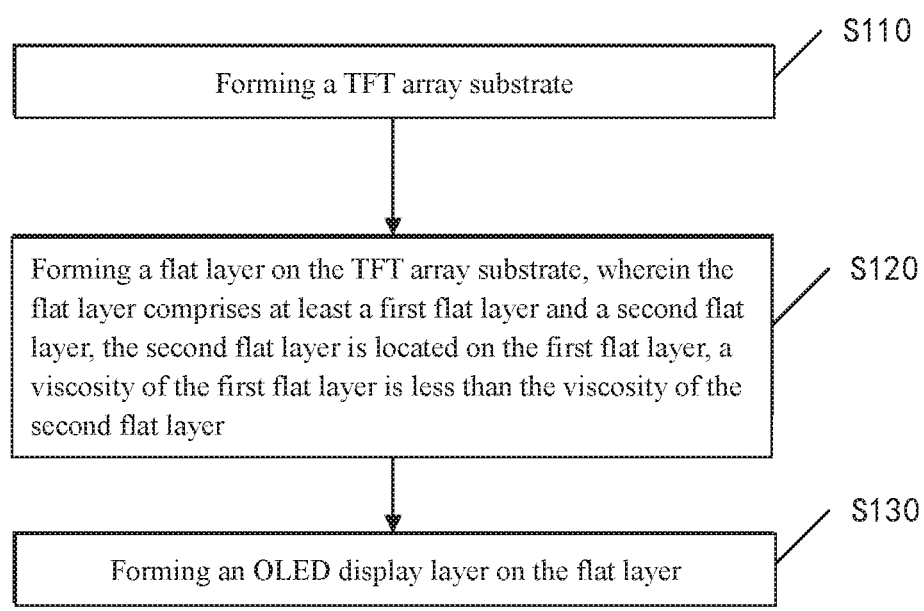
FIG. 2 is a flowchart illustrating the manufacturing method of the OLED display panel in accordance with one embodiment of the present disclosure.

FIG. 2 is a flowchart illustrating the manufacturing method of the OLED display panel in accordance with one embodiment of the present disclosure.

In step S110: forming a TFT array substrate 110;

In one embodiment, the TFT array substrate 110 includes a base substrate 111 and a TFT layer 112.

In step S120: forming the flat layer 120 on the TFT array substrate 110, wherein the flat layer 120 includes at least a first flat layer 121 and a second flat layer 122. The second flat layer 122 is located on the first flat layer 121. The viscosity of the first flat layer 121 is lower than that of the second flat layer 122.

In the embodiment, the viscosity of the first flat layer 121 is less than 4 cP, and the viscosity of the second flat layer 122 is less than 4 cP. In one embodiment, the thickness of the flat layer 120 is 1 μm-6 μm. Specifically, the thickness of the first flat layer 121 is 0.5 μm-3 μm, and the thickness of the second flat layer is 0.5 μm-3 μm. In this embodiment, the first flat layer 121 and the second flat layer 122 are coated twice and then formed through a yellow light process, so that there is no need to increase the yellow light process.

In step S130: forming an OLED display layer 130 on the flat layer 120.

In one embodiment, the OLED display layer 130 includes a first electrode layer 131, a pixel definition layer 132, an OLED light emitting layer 133, and a second electrode layer 134. In one embodiment, the OLED light emitting layer 133 is formed by an inkjet printing process.

It should be noted that each embodiment in the present disclosure is described in a progressive manner, and each embodiment focuses on the difference from other embodiments. With respect to the embodiment describing the apparatus, since it is basically similar to the method embodiment, the description is relatively simple. For the related parts, reference may be made to part of the description of the method embodiments.

In view of the above, the flat layer includes a first flat layer and a second planarization layer, the second flat layer is located on the first planarization layer, and the first flat layer has a lower viscosity than the second planarization layer. The viscosity of the first layer is lower, so that the flattening effect of the first flat layer is good. The film thickness of the subsequently formed OLED light emitting layer is also relatively uniform, so does the light emission. In addition, the amount of gaseous impurities is relatively small, and gas impurities generated from the underlying film layer can be prevented from being transmitted upward. As such, the influence of gas impurities on the OLED display layer can be reduced. Therefore, the overall quality of the OLED display panel is better.

The above description is merely the embodiments in the present disclosure, the claim is not limited to the description thereby. The equivalent structure or changing of the process of the content of the description and the figures, or to implement to other technical field directly or indirectly should be included in the claim.

What is claimed is:

1. An organic light emitting diode (OLED) display panel, comprising:
   a thin film transistor (TFT) array substrate;
   a flat layer arranged on the TFT array substrate, the flat layer comprising a first flat layer and a second flat layer, the second flat layer being arranged on the first flat layer, and a viscosity of the first flat layer being less than a viscosity of the second flat layer; and
   an OLED display layer arranged on the flat layer,
   wherein the second flat layer is made of a material that is denser than the first flat layer and the denser material of the second flat layer is disposed atop the first flat layer for blocking upward migration of gaseous impurities from the first flat layer into the OLED display layer.

2. The OLED display panel as claimed in claim 1, wherein the viscosity of the first flat layer is less than 4 centipoise (cP).

3. The OLED display panel as claimed in claim 1, wherein the viscosity of the second flat layer is greater than or equal to 4 cP.

4. The OLED display panel as claimed in claim 1, wherein a thickness of the flat layer is in a range from 1 to 6 µm.

5. The OLED display panel as claimed in claim 2, wherein a thickness of the flat layer is in a range from 1 to 6 µm.

6. The OLED display panel as claimed in claim 3, wherein a thickness of the flat layer is in a range from 1 to 6 µm.

7. The OLED display panel as claimed in claim 4, wherein the thickness of the first flat layer or/and the second flat layer is in a range from 0.5 to 3 µm.

8. The OLED display panel as claimed in claim 5, wherein the thickness of the first flat layer or/and the second flat layer is in a range from 0.5 to 3 µm.

9. The OLED display panel as claimed in claim 6, wherein the thickness of the first flat layer or/and the second flat layer is in a range from 0.5 to 3 µm.

10. The OLED display panel as claimed in claim 1, wherein the first flat layer is made of an acrylic material and the second flat layer is made of a polyimide material.

11. The OLED display panel as claimed in claim 2, wherein the first flat layer is made of an acrylic material the second flat layer is made of a polyimide material.

12. The OLED display panel as claimed in claim 3, wherein the first flat layer is made of an acrylic material and the second flat layer is made of a polyimide material.

13. The OLED display panel as claimed in claim 1, wherein the OLED display layer comprises a first electrode layer, a pixel defining layer, an OLED light emitting layer, and a second electrode layer, wherein the first electrode layer is one of an anode and a cathode, and the second electrode layer is the other one of the anode and the cathode.

14. The OLED display panel as claimed in claim 2, wherein the OLED display layer comprises a first electrode layer, a pixel defining layer, an OLED light emitting layer, and a second electrode layer, wherein the first electrode layer is one of an anode and a cathode, and the second electrode layer is the other one of the anode and the cathode.

15. The OLED display panel as claimed in claim 3, wherein the OLED display layer comprises a first electrode layer, a pixel defining layer, an OLED light emitting layer, and a second electrode layer, wherein the first electrode layer is one of an anode and a cathode, and the second electrode layer is the other one of the anode and the cathode.

16. The OLED display panel as claimed in claim 13, wherein the OLED light emitting layer is formed by an inkjet printing process.

17. The OLED display panel as claimed in claim 14, wherein the OLED light emitting layer is formed by an inkjet printing process.

18. The OLED display panel as claimed in claim 1, wherein the TFT array substrate comprises a base substrate and a TFT layer, and the TFT layer is formed on the base substrate.

19. The OLED display panel as claimed in claim 2, wherein the TFT array substrate comprises a base substrate and a TFT layer, and the TFT layer is formed on the base substrate.

20. A manufacturing method of an OLED display panel, comprising:
    forming a TFT array substrate;
    forming a flat layer on the TFT array substrate, wherein the flat layer comprises at least a first flat layer and a second flat layer, the second flat layer being located on the first flat layer, a viscosity of the first flat layer being less than a viscosity of the second flat layer; and
    forming an OLED display layer on the flat layer,
    wherein the second flat layer is made of a material that is denser than the first flat layer and the denser material of the second flat layer is disposed atop the first flat layer for blocking upward migration of gaseous impurities from the first flat layer into the OLED display layer.

* * * * *